(12) United States Patent
Covino

(10) Patent No.: US 6,737,894 B1
(45) Date of Patent: May 18, 2004

(54) METHOD AND APPARATUS FOR GENERATING IMPEDANCE MATCHED OUTPUT SIGNALS FOR AN INTEGRATED CIRCUIT DEVICE

(75) Inventor: James J. Covino, Middlesex, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/249,700

(22) Filed: May 1, 2003

(51) Int. Cl.[7] .............................. H03B 1/00; H03K 3/00
(52) U.S. Cl. ....................................... 327/108
(58) Field of Search ................... 327/108, 109, 327/112, 403; 326/30, 82–87, 89–91

(56) References Cited

U.S. PATENT DOCUMENTS

| | | |
|---|---|---|
| 5,397,943 A | 3/1995 | West et al. |
| 5,838,177 A | 11/1998 | Keeth |
| 6,069,504 A | 5/2000 | Keeth |
| 6,256,235 B1 * | 7/2001 | Lee ........................ 365/189.11 |
| 6,292,407 B1 * | 9/2001 | Porter et al. ........... 365/189.11 |
| 6,566,904 B2 * | 5/2003 | van Bavel et al. ............ 326/30 |
| 6,593,781 B2 * | 7/2003 | Yoshimura ................... 327/110 |
| 6,617,891 B2 * | 9/2003 | Srikanth et al. ............ 327/108 |

* cited by examiner

Primary Examiner—My-Trang Nu Ton
(74) Attorney, Agent, or Firm—Richard A. Henkler; Bracewell & Patterson, L.L.P.

(57) ABSTRACT

An apparatus for generated impedance matched output signals for an integrated circuit is disclosed. The apparatus includes a master true driver circuit, a master complement driver circuit and multiple clone output driver circuits. The master true driver circuit includes a first driver control, a first output driver, a first impedance matching resistor and a first load. The master complement driver circuit includes a second driver control, a second output driver, a second impedance matching resistor and a second load. The clone output driver circuits, which are substantially identical to each other, can produce impedance matched output signals to their respective substantially identical loads. Each of the clone output driver circuit includes a driver control, a first unity gain amplifier, a second unity gain amplifier and a load. The inputs to the first and second unity gain amplifiers are supplied by the master true circuit and the master complement circuit via the driver control.

20 Claims, 2 Drawing Sheets

METHOD AND APPARATUS FOR GENERATING IMPEDANCE MATCHED OUTPUT SIGNALS FOR AN INTEGRATED CIRCUIT DEVICE

BACKGROUND OF INVENTION

1. Technical Field

The present invention relates to integrated circuits in general, and, in particular, to integrated circuit devices having output drivers. Still more particularly, the present invention relates to a method and apparatus for generating impedance matched output signals for an integrated circuit device.

2. Description of the Related Art

The clock rates of modern integrated circuit devices now routinely operate beyond 500 MHz. At such high frequencies, the output ports of an integrated circuit device to which interconnects on a printed circuit board are connected are required to have their impedance matched with the intrinsic impedance of the interconnects in order to minimize signal reflections (or ringing) on the interconnects during data transmissions. Otherwise, the occurrence of signal reflections on interconnects can add delays to the signal transmission time, both at the receiving end of the interconnects and at any intermediate taps along the interconnects.

Since signal reflection errors increase with the operating speed of an integrated circuit device, it becomes even more important to match the impedance of interface circuits, such as output driver circuits, of an ultra-high speed integrated circuit device with the impedances of associated interconnects on a printed circuit board in order to prevent signal reflection errors during the transmission of high-frequency signals. As such, when designing a printed circuit board, discrete impedance matching resistors, which have comparable impedance as the impedance of the interconnects on the printed circuit board, are added between the output driver circuits within the integrated circuit device and the interconnects on the printed circuit board for the purpose of impedance matching. In this way, the impedance of the interface circuits is "automatically" matched with the impedances of the interconnects on the printed circuit board, according to the values of the discrete resistors. However, the addition of impedance matching resistors is costly, consumes a relatively large amount of area and may even affect the performance of the interface circuit within the integrated circuit device. As such, it is desirable to provide an improved method for generating impedance matched output signals for an integrated circuit device such that the usage of impedance matching resistors can be minimized.

SUMMARY OF INVENTION

In accordance with a preferred embodiment of the present invention, an apparatus for generating output signals with impedance matching for an integrated circuit includes a master true driver circuit, a master complement driver circuit and multiple clone output driver circuits. The master true driver circuit includes a first driver control, a first output driver, a first impedance matching resistor and a first load. The master complement driver circuit includes a second driver control, a second output driver, a second impedance matching resistor and a second load. The clone output driver circuits, which are substantially identical to each other, can produce impedance matched output signals to their respective substantially identical loads. Each of the clone output driver circuit includes a driver control, a first unity gain amplifier, a second unity gain amplifier and a load. The inputs to the first and second unity gain amplifiers are supplied by the master true circuit and the master complement circuit via the driver control.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
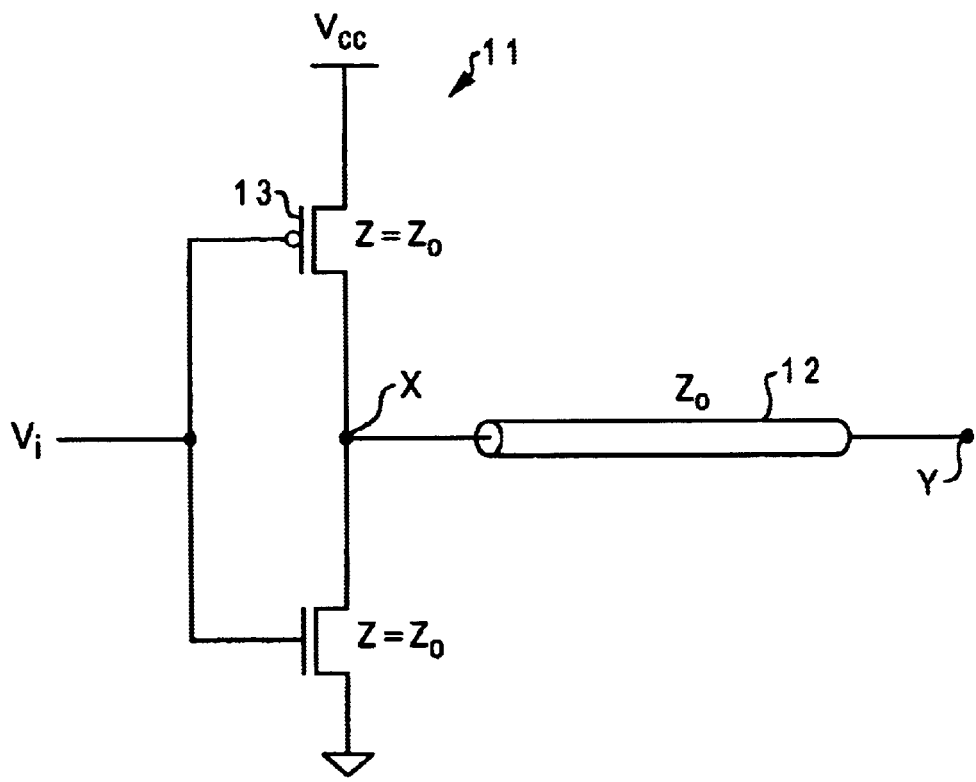
FIG. 1 is a circuit diagram of an output driver within an integrated circuit device, according to the prior art.

Referring now to the drawings and in particular to FIG. 1, there is depicted a circuit diagram of an output driver within an integrated circuit device, according to the prior art. As shown, an output driver 11 is connected to an interconnect 12 having an intrinsic impedance Zo. During normal operation, when an input voltage Vi is at a logical low level, the pull-up section of output driver 11 (i.e., p-channel transistor 13) is at a low impedance state Typically, the impedance of interconnect 12 at the low impedance state is substantially equal to impedance Zo such that the impedance of interconnect 12 can be serially terminated. With p-channel transistor 13 at the low impedance state, Vdd is coupled to interconnect 12. By voltage division, half of Vdd travels down interconnect 12 from a node X. The other end of interconnect 12, node Y, is usually connected to a gate of another device that typically has a very high impedance. When half of Vdd reaches node Y, it is reflected back through interconnect 12. Due to the reflected signal directly adding to the incident signal, the level of voltage at node Y becomes approximately Vdd the logical high level. The Vdd signal then propagates back towards node X. Once the Vdd signal reaches node X, the Vdd signal turns p-channel transistor 13 off, and output driver 11 reaches its stable state. Similarly, if Vi is at a logical high level, node Y, in its stable state, will be at the logical low level.

For high-performance integrated circuits having multiple input/output (I/O) networks, accurate impedance matching are required for output drivers, such as output driver 11. Thus, impedance matching resistors are commonly placed between output drivers, such as output driver 11, and their corresponding interconnect, such as interconnect 12, to provide the necessary impedance matching. But impedance matching resistors, which are usually located off-chip, are generally cumbersome and may also hamper circuit performance as data rate increases.

The present invention provides an improved method for generating impedance matched output signals for an integrated circuit device such that the usage of impedance matching resistors can be minimized. The basic idea of the present invention is to utilize a master true input/output (I/O) circuit and a master complement I/O circuit as the base circuit for a group of clone output drivers to generate clone output signals. Each of the master true I/O circuit and the master complement I/O circuit preferably includes an output driver, a driver control circuit, an impedance matching resistor and a load. The master true I/O circuit and the master complement I/O circuit form a complementary circuit pair that is switched on every I/O cycle. Together, the master true I/O circuit and the master complement I/O circuit generate a master waveform having alternate logical ones and zeros. The clone output drivers, each includes two unity gain amplifiers and a driver control block, generate a respective clone waveform based on the master waveform.

Figure 2:
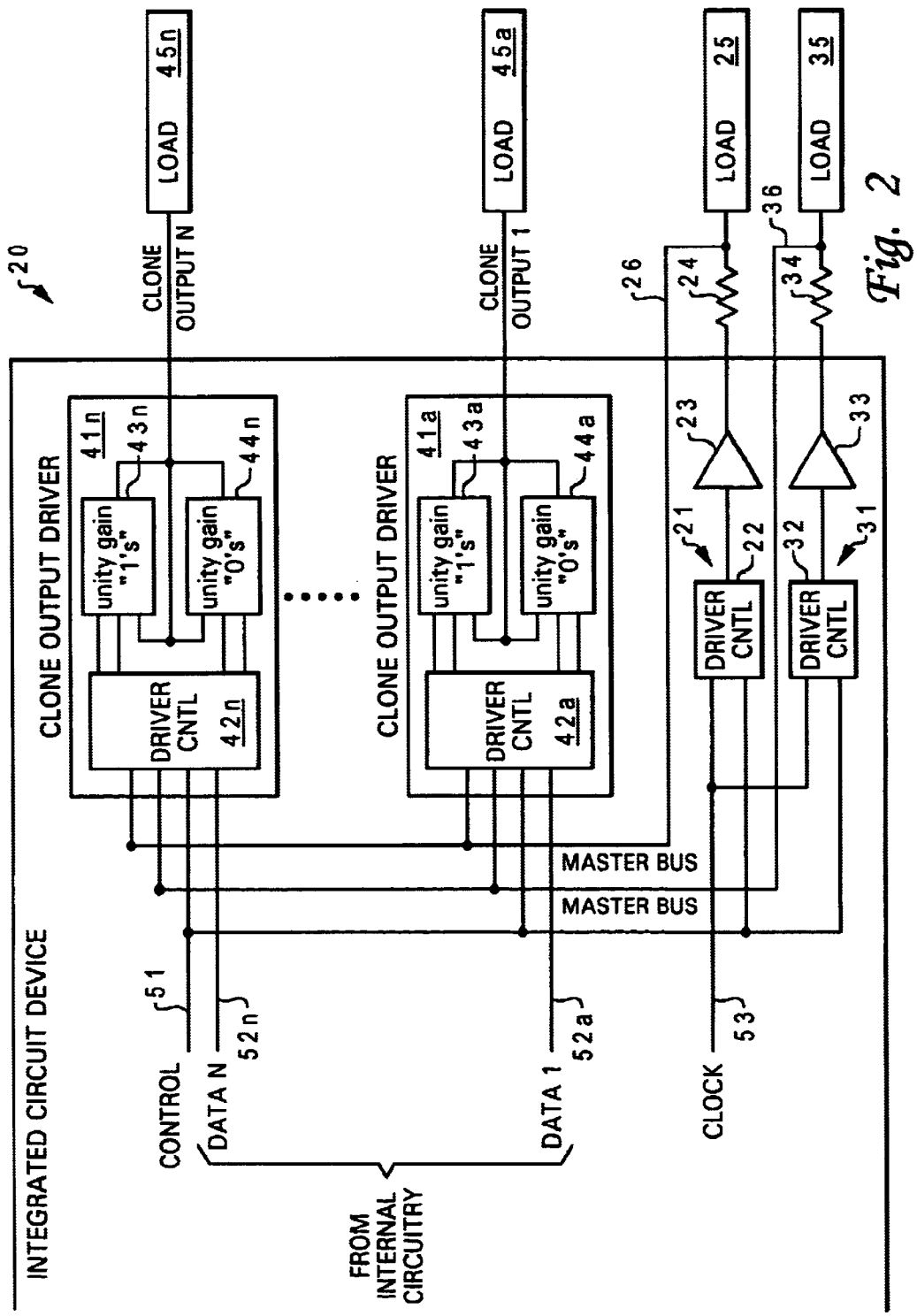
FIG. 2 is a circuit diagram of an apparatus for generating impedance matched output signals for an integrated circuit, in accordance with a preferred embodiment of the present invention.

With reference now to FIG. 2, there is depicted a circuit diagram of an apparatus for generating impedance matched output signals for an integrated circuit, in accordance with a preferred embodiment of the present invention. As shown, a clone output signal generating apparatus 20 includes a master true I/O circuit 21 and a master complement I/O circuit 31 along with multiple clone output driver circuits 41a–41n. Master true I/O circuit 21 and master complement I/O circuit 31 are substantially identical to each other. Master true I/O circuit 21 includes a driver control block 22, an output driver 23, an impedance matching resistor 24 and a load 25. Similarly, master complement I/O circuit 31 includes a driver control block 32, an output driver 33, an impedance matching resistor 34 and a load 35.

For master true I/O circuit 21, driver control block 22 and output driver 23 are preferably located on-chip while impedance matching resistor 24 and load 25 are preferably located off-chip. Similarly, for master complement I/O circuit 31, driver control block 32 and output driver 33 are preferably located on-chip while impedance matching resistor 34 and load 35 are preferably located off-chip. Master true I/O circuit 21 and master complement I/O circuit 31 form a complementary circuit pair that is alternatively switched on every single clock cycle. Under the direction of a master control input 51, master true I/O circuit 21 and master complement I/O circuit 31 function together to independently and concurrently generate two separate output signals, one on a master true bus 26 and the other on a master complement bus 36. Preferably, the output signals on master complement bus 36 are always the complement of the output signals on master complement bus 26. As such, the two separate output signals on master true bus 26 and master complement bus 36 can be collectively viewed as a single master waveform having alternate logical ones and zeros.

Impedance matching resistor 24 guarantees the output signals from output driver 23 to load 25 are impedance matched. Similarly, impedance matching resistor 34 guarantees the output signals from output driver 33 to load 35 are impedance matched. The output signals on master true bus 26 and master complement bus 36 (i.e., the master waveform) are, in turn, fed to clone output drivers 41a–41n via master true bus 26 and master complement bus 36, respectively.

Clone output drivers 41a–41n are substantially identical to each other. Each of clone output drivers 41a–41n includes a driver control block, two unity gain amplifiers and a load. For example, clone output driver 41a includes a driver control block 42a, unity gain amplifiers 43a–44a and a load 45a; clone output driver 41n includes a driver control block 42n, unity gain amplifiers 43n–44n and a load 45n. Data output signals from internal circuitry (not shown) are sent to clone output drivers 41a–41n via data lines 52a–52n respectively. Driver control blocks 42a–42n are synchronized with driver control blocks 22 and 32 via a common clock signal 53 from, for example, an echo clock or a data out clock. Unity gain amplifiers 43a–43n are for amplifying logical one signals, and unity gain amplifiers 44a–44n are for amplifying logical zero signals. Although two unity gain amplifiers are utilized within each of driver control blocks 42a–42n, it is understood by those skilled in the art that a single unity gain amplifier may also suffice for the purpose of the present invention. The impedances of loads 45a–45n are identical to the impedances of loads 25 and 35 of master true I/O circuit 21 and master complement I/O circuit 31, respectively.

Under the direction of driver control blocks 42a–42n, the output signals from either master true bus 26 and master complement bus 36 are supplied to an appropriate one of unity gain amplifiers 43a–43n or unity gain amplifiers 44a–44n, respectively, in accordance with the corresponding data output signals from data lines 52a–52n. For example, if a data output signal from data line 52a is a logical one signal, then the output signal from either master true bus 26 or master complement bus 36 is supplied to unity gain amplifier 43a, depending on the logical level of the signal on master true bus 26 and master complement bus 36 at the time. Otherwise, if a data output signal from data line 52a is a logical zero signal, then the output signal from either master true bus 26 or master complement bus 36 is supplied to unity gain amplifier 44a, depending on the logical level of the signal on master true bus 26 and master complement bus 36 at the time. In other words, driver control blocks 42a–42n are responsible to direct either unity gain amplifiers 43a–43n to output logical ones or unity gain amplifiers 44a–44n to output logical zeros, respectively according to the logical level of the data output signal from data lines 52a–52n and the logical level of the output signal on the master waveform.

Because clone output drivers 41a–41n are substantially identical to each other, clone output drivers 41a–41n can simultaneously yield substantially identical clone output signals to loads 45a–45n, respectively. Since the impedances of loads 25 and 35 are identical with the impedances of loads 45a–45n, all the clone output signals from clone output drivers 41a–41n are impedance matched with loads 45a–45n.

As has been described, the present invention provides an apparatus for generating impedance matched output signals for an integrated circuit. With the present invention, the usage of impedance matching resistors can be minimized.

While the invention has been particularly shown and described with reference to a preferred embodiment, it will be understood by those skilled in the art that various changes in form and detail may be made therein without departing from the spirit and scope of the invention.

I claim:

1. An apparatus for generating impedance matched output signals for an integrated circuit, said apparatus comprising:
   a master true driver circuit;
   a master complement driver circuit; and
   a plurality of clone output driver circuits, coupled to said master true driver circuit and said master complement driver circuit, for yielding a plurality of impedance matched outputs signals to their respective substantially identical loads in accordance with master signals supplied by said master true circuit and said master complement circuit.

2. The apparatus of claim 1, wherein said master true driver circuit includes a first driver control, a first output driver, a first impedance matching resistor and a first load.

3. The apparatus of claim 2, wherein said first driver control and said first output driver are located on-chip, and said first impedance matching resistor and said first load are located off-chip.

4. The apparatus of claim 2, wherein said master complement driver circuit includes a second driver control, a second output driver, a second impedance matching resistor and a second load.

5. The apparatus of claim 4, wherein said second driver control and said second output driver are located on-chip, and said second impedance matching resistor and said second load are located off-chip.

6. The apparatus of claim 4, wherein each of said plurality of clone output driver circuits includes a driver control, a first unity gain amplifier, a second unity gain amplifier and a load.

7. The apparatus of claim 6, wherein impedances of said first load from said master true driver circuit, said second load from said master complement driver circuit and said loads from said plurality of clone output driver circuits are substantially identical.

8. The apparatus of claim 6, wherein impedances of said first load from said master true driver circuit, said second load from said master complement driver circuit and said loads from said plurality of clone output driver circuits are interconnects on a printed circuit board.

9. The apparatus of claim 6, wherein said first output driver from said master true driver circuit, said second driver control from said master complement driver circuit and said driver controls from said plurality of clone output driver circuits are controlled by a common clock.

10. The apparatus of claim 6, wherein logic levels of said outputs from said plurality of clone output driver circuits are generated according to data lines from internal circuitry.

11. An apparatus for generating impedance matched output signals for an integrated circuit, said apparatus comprising:

a master true driver circuit having a first driver control, a first output driver, a first impedance matching resistor and a first load;

a master complement driver circuit having a second driver control, a second output driver, a second impedance matching resistor and a second load; and a plurality of clone output driver circuits for yielding substantially identical impedance matched outputs signals to their respective substantially identical loads, wherein each of said plurality of clone output driver circuit includes a driver control, an unity gain amplifier and a load, wherein inputs to said unity gain amplifier are supplied by said master true circuit and said master complement circuit.

12. The apparatus of claim 11, wherein said first driver control and said first output driver are located on-chip, and said first impedance matching resistor and said first load are located off-chip.

13. The apparatus of claim 11, wherein said second driver control and said second output driver are located on-chip, and said second impedance matching resistor and said second load are located off-chip.

14. The apparatus of claim 11, wherein impedances of said first load from said master true driver circuit, said second load from said master complement driver circuit and said loads from said plurality of clone output driver circuits are substantially identical.

15. The apparatus of claim 11, wherein said first output driver from said master true driver circuit, said second driver control from said master complement driver circuit and said driver controls from said plurality of clone output driver circuits are controlled by a common clock.

16. The apparatus of claim 11, wherein logic levels of said outputs from said plurality of clone output driver circuits are generated according to data lines from internal circuitry.

17. The apparatus of claim 11, wherein impedances of said first load from said master true driver circuit, said second load from said master complement driver circuit and said loads from said plurality of clone output driver circuits are interconnects on a printed circuit board.

18. A method for generating impedance matched output signals for an integrated circuit, said method comprising:

generating a master true signal;

generating a master complement signal, wherein said master complement signal is complementary of said master true signal; and basing on said master true and master complement signals, generating a plurality of impedance matched outputs signals to their respective substantially identical loads according to a corresponding data input.

19. The method of claim 18, wherein said master true signal is generated by a master true driver circuit having a first driver control, a first output driver, a first impedance matching resistor and a first load.

20. The method of claim 19, wherein said master complement signal is generated by a master complement driver circuit having a second driver control, a second output driver, a second impedance matching resistor and a second load.

* * * * *